US006834713B2

(12) United States Patent
Ghosh et al.

(10) Patent No.: US 6,834,713 B2
(45) Date of Patent: *Dec. 28, 2004

(54) THERMOSIPHON FOR ELECTRONICS COOLING WITH NONUNIFORM AIRFLOW

(75) Inventors: Debashis Ghosh, Amherst, NY (US); Shrikant Mukund Joshi, Williamsville, NY (US); Ilya Reyzin, Williamsville, NY (US); Mohinder Singh Bhatti, Amherst, NY (US)

(73) Assignee: Delphi Technologies, Inc., Troy, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 10/198,322

(22) Filed: Jul. 18, 2002

(65) Prior Publication Data

US 2004/0011511 A1 Jan. 22, 2004

(51) Int. Cl.[7] .................... F28D 15/00; H05K 7/20
(52) U.S. Cl. .................... 165/104.33; 165/104.21; 174/15.2; 257/715; 361/700
(58) Field of Search .................. 165/104.21, 104.33, 165/121, 122, 124, 125, 80.3, 104.26, 185; 174/15.2, 16.3; 257/715, 722, 714; 361/700, 697, 704–710

(56) References Cited

U.S. PATENT DOCUMENTS

| 2,703,257 | A | * | 3/1955 | Norris ........................ 239/216 |
| 5,946,932 | A | * | 9/1999 | Wang ........................... 62/305 |
| 5,998,863 | A | * | 12/1999 | Kobayashi et al. ......... 257/715 |
| 6,588,498 | B1 | | 7/2003 | Reyzin et al. |
| 6,714,413 | B1 | * | 3/2004 | Ghosh et al. ............... 361/700 |

* cited by examiner

Primary Examiner—Ramesh Krishnamurthy
(74) Attorney, Agent, or Firm—Patrick M. Griffin

(57) ABSTRACT

A heat sink assembly for cooling an electronic device comprises a fan housed in a shroud, the fan including a hub and fan blades extending therefrom for causing an axially directed airflow through the shroud upon rotation of the fan blades. A thermosiphon comprises an evaporator defining an evaporating chamber containing a working fluid therein and further including a condenser mounted thereabove. The thermosiphon is positioned at one end of the shroud such that the fan is aligned with the condenser for directing the axial airflow therethrough. The condenser includes a plurality of tubes forming a tube grouping. Each tube having an opening in fluid communication with the evaporator and for receiving and condensing vapor of the working fluid received from the evaporator. The tubes are axially aligned with the airflow and are laterally positioned such that a lateral width of the tube grouping is approximately equal to a width of the hub and substantially in lateral alignment therewith.

49 Claims, 5 Drawing Sheets

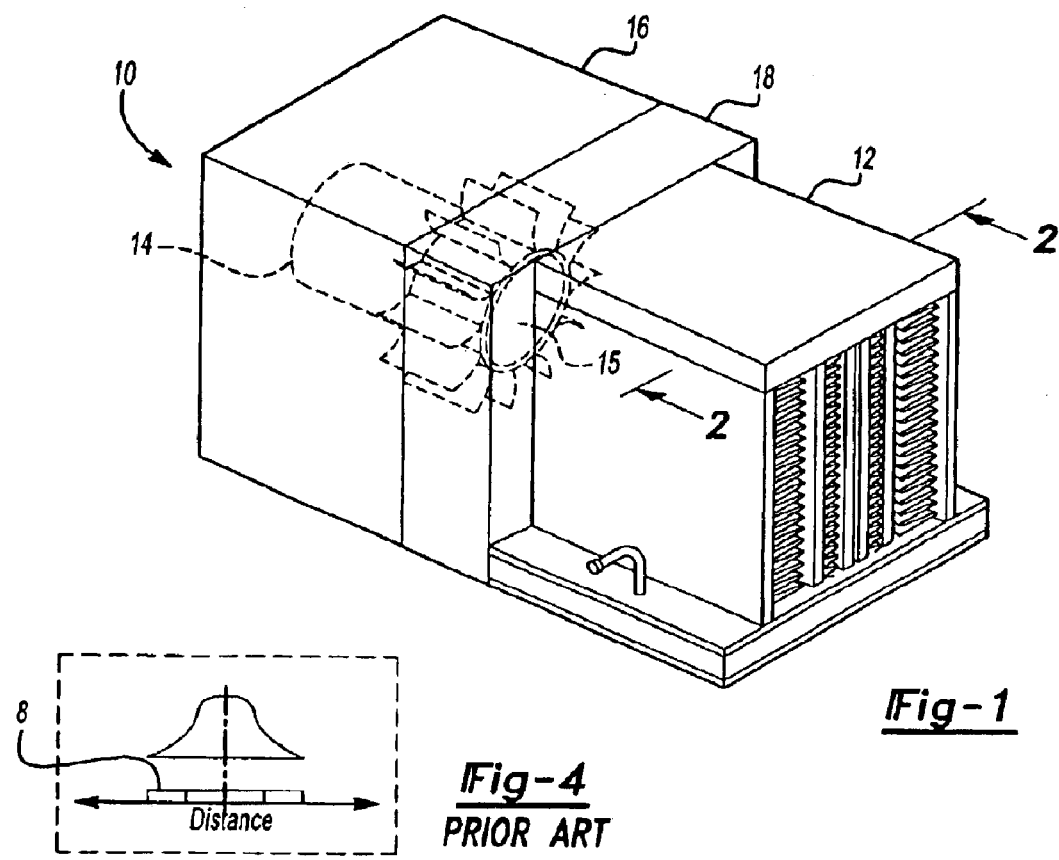
*Fig-1*
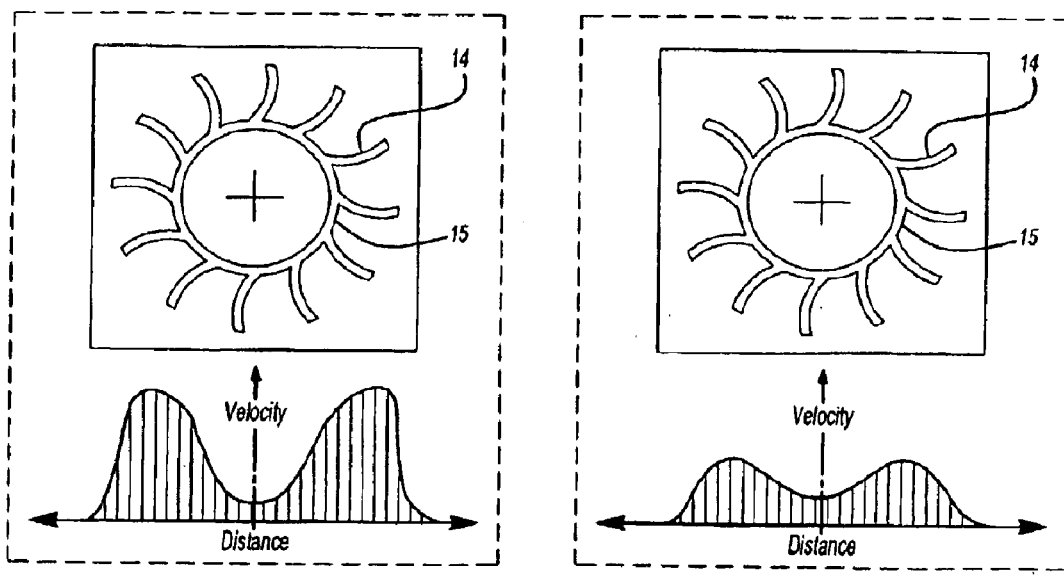
*Fig-4*
PRIOR ART
*Fig-5A*
PRIOR ART
*Fig-5B*
PRIOR ART

THERMOSIPHON FOR ELECTRONICS COOLING WITH NONUNIFORM AIRFLOW

TECHNICAL FIELD

The present invention relates to heat sinks in general, and more particularly to heat sinks for use in dissipating waste heat generated by electrical or electronic components and assemblies.

BACKGROUND OF THE INVENTION

Research activities have focused on developing heat sinks to efficiently dissipate heat from highly concentrated heat sources such as microprocessors and computer chips. These heat sources typically have power densities in the range of about 5 to 35 W/cm$^2$ (4 to 31 Btu/ft$^2$s) and relatively small available space for placement of fans, heat exchangers, heat sinks and the like.

At the component level, various types of heat exchangers and heat sinks have been used that apply natural or forced convection or other cooling methods. The most commonly existing heat sinks for microelectronics cooling have generally used air to directly remove heat from the heat source. However, air has a relatively low heat capacity. Such heat sinks are suitable for removing heat from relatively low power heat sources with power density in the range of 5 to 15 W/cm$^2$ (4 to 13 Btu/ft$^2$s). Increases in computing speed resulted in corresponding increases in the power density of the heat sources in the order of 20 to 35 W/cm$^2$ (18 to 31 Btu/ft$^2$s) thus requiring more effective heat sinks. Liquid-cooled heat sinks employing high heat capacity fluids like water and water-glycol solutions are more particularly suited to remove heat from these types of high power density heat sources. One type of liquid cooled heat sink circulates the cooling liquid so that the liquid removes heat from the heat source and is then transferred to a remote location where the heat is easily dissipated into a flowing air stream with the use of a liquid-to-air heat exchanger. These types of heat sinks are characterized as indirect heat sinks.

As computing speeds continue to increase even more dramatically, the corresponding power densities of the devices rise up to 100 W/cm$^2$. The constraints of the necessary cooling system miniaturization coupled with high heat flux calls for extremely efficient, compact, simple and reliable heat sinks such as a thermosiphon. A typical thermosiphon comprises an evaporating section and a condensing section. The heat-generating device is mounted to the evaporating section. In some thermosiphons, the heat-generating device is affixed to the internal surface of the evaporating section where it is submerged in the working fluid. Alternatively, the heat-generating device can also be affixed to the external surface of the evaporating section. The working fluid of the thermosiphon is generally a halocarbon fluid, which circulates in a closed-loop fashion between the evaporating and condensing sections. The captive working fluid changes its state from liquid-to-vapor in the evaporating section as it absorbs heat from the heat-generating device. Reverse transformation of the working fluid from vapor-to-liquid occurs as it rejects heat to a cooling fluid like air flowing on an external finned surface of the condensing section. The thermosiphon relies exclusively on gravity for the motion of the working fluid between the evaporating and condensing sections. As for the motion of the cooling fluid on the external surface of the condensing section, a fluid moving device like an axial fan is employed.

Most electronics devices have high degree of non-uniformity built into them. Thermal management of these devices is subject to two constraints that the thermal engineer must address. First, the heat flux generated by the electronics device is highly non-uniform. Second, the air circulated by the air-moving device like an axial fan is very non-uniformly distributed. Most computer chips have their heat generation concentrated in a very small region in the core of the chip. For example, a typical 40×40 mm$^2$ computer chip has almost 80% of its total heat flux concentrated in its central 10×10 mm$^2$ surface. The heat flux distribution in a typical electronics device is shown schematically in FIG. 4. The second non-uniformity is attributed to the attachment of the air-moving device like an axial fan attached to the exterior of the thermosiphon. Axial fan has a large hub which acts as blockage to airflow. The airflow exiting the axial fan is highly concentrated in the peripheral region of the fan blades as shown in FIG. 5. The maximum air velocity is in the tip region of fan blades. The velocity falls off sharply to zero in the central hub region. Under certain flow conditions and blade angle, the local velocity at the root of the fan blade may even become negative, i.e., opposite to the direction of the predominant airflow.

The non-uniformity of airflow is far more pronounced in push mode wherein the fan blows relatively cooler ambient air into the heat exchanger. In pull mode, on the other hand, the fan sucks relatively hotter air from the heat exchanger. For a high heat load push mode is advantageous when airflow rate is low. In order to attain flatter airflow profile entering the heat exchanger face a standoff distance of at least three times the hub diameter is preferable between the fan and the heat exchanger. However, because of packaging constraints only about one-fifth to one-quarter of the hub diameter standoff distance is typically available between the fan and heat exchanger. This is because the airflow at the heat exchanger face is non-uniform.

A limitation of the axial fan relating to smallness of the pressure rise across the fan needs to be borne in mind. The curve of the pressure head developed by the fan falls off very rapidly as the volumetric flow rate of air increases. In other words, the air exiting an axial fan cannot sustain a high-pressure drop through the fins. Therefore, managing the airflow through the heat sink at a low-pressure drop is a very important consideration in the design of a thermosiphon.

It is apparent from the foregoing considerations that from a system's point of view, the computer chip, heat sink and fan assembly are constrained not only by very non-uniform heat flux but also by non-uniform airflow capable of sustaining small pressure drop across the heat exchanger. Ideally, the airflow should be high in regions of high heat flux and low in regions of low heat flux. Overlaying FIGS. 4 and 5 in push mode clearly reveals that the airflow distribution is opposite to that ideally desired for better heat transfer. This is detrimental to the functioning of a computer chip, as the chip junction temperature becomes high because of inadequate heat removal locally from the core of the chip. The thermal performance penalty attributed to these non-uniformities can be of the order of 25 to 50% compared to the case with uniform heat flux and uniform airflow. Thus thermal solution becomes considerably more challenging when the heat flux as well as the airflow is non-uniform. The difficulty is compounded when the available airflow rate is small. Therefore, careful attention must be paid to the fluid flow and heat transfer boundary conditions when developing the thermal solutions for the computer chips.

The compact thermosiphons intended to fit in a computer case require boiling and condensing processes to occur in close proximity to each other thereby imposing conflicting thermal conditions in a relatively small volume. This poses significant challenges to the process of optimizing the thermosiphon performance.

Thus, what is desired is a thermosiphon optimization process to intensify the processes of boiling, condensation and convective heat transfer at the external surface of the condenser while maintaining low airside pressure drop.

SUMMARY OF THE INVENTION

One aspect of the present invention is a heat sink assembly for cooling an electronic device. The heat sink assembly comprises a fan housed in a shroud, the fan having a hub and fan blades extending therefrom for causing an axially directed airflow through the shroud upon rotation of the fan blades. A thermosiphon is positioned at one end of the shroud such that the fan is aligned with the condenser for directing the axial airflow therethrough. The thermosiphon comprises an evaporator defining an evaporating chamber containing a working fluid therein and further including a condenser mounted thereabove. The condenser includes a plurality of tubes forming a tube grouping. Each tube having an opening in fluid communication with the evaporator and for receiving and condensing vapor of the working fluid received from the evaporator. The tubes are axially aligned with the airflow and are laterally positioned such that a lateral width of the tube grouping is approximately equal to a width of the hub and substantially in lateral alignment thereto.

Another aspect of the present invention is a condenser for a heat sink assembly for cooling an electronic device. The heat sink assembly comprises a base having an upper housing affixed thereto wherein the upper housing has open ends. A fan is mounted at one of the open ends, the fan having a hub and fan blades extending therefrom for causing an axially directed airflow through the housing upon rotation of the fan blades. A plurality of tubes is positioned within the housing for transmitting therethrough a vapor of a working fluid. The tubes define a tube grouping such that the tubes are arranged in axial alignment with the fan and laterally positioned such that a lateral width of the tube grouping is approximately equal to a width of the hub and substantially in lateral alignment thereto.

These and other advantages of the invention will be further understood and appreciated by those skilled in the art by reference to the following written specification, claims and appended drawings.

BRIEF DESCRIPTION OF THE DRAWINGS

FIG. 1 is a perspective view of a heat sink assembly embodying the present invention, wherein an axial fan is arranged to draw cooling air through a thermosiphon.

FIG. 4 is a typical heat flux distribution of an electronic device requiring cooling.

FIG. 5A is a typical air velocity distribution just downstream of the axial fan used in conjunction with a thermosiphon in push mode.

FIG. 5B is a typical air velocity distribution just upstream of the axial fan used in conjunction with a thermosiphon in pull mode

DETAILED DESCRIPTION OF THE PREFERRED EMBODIMENT

Figure 2:
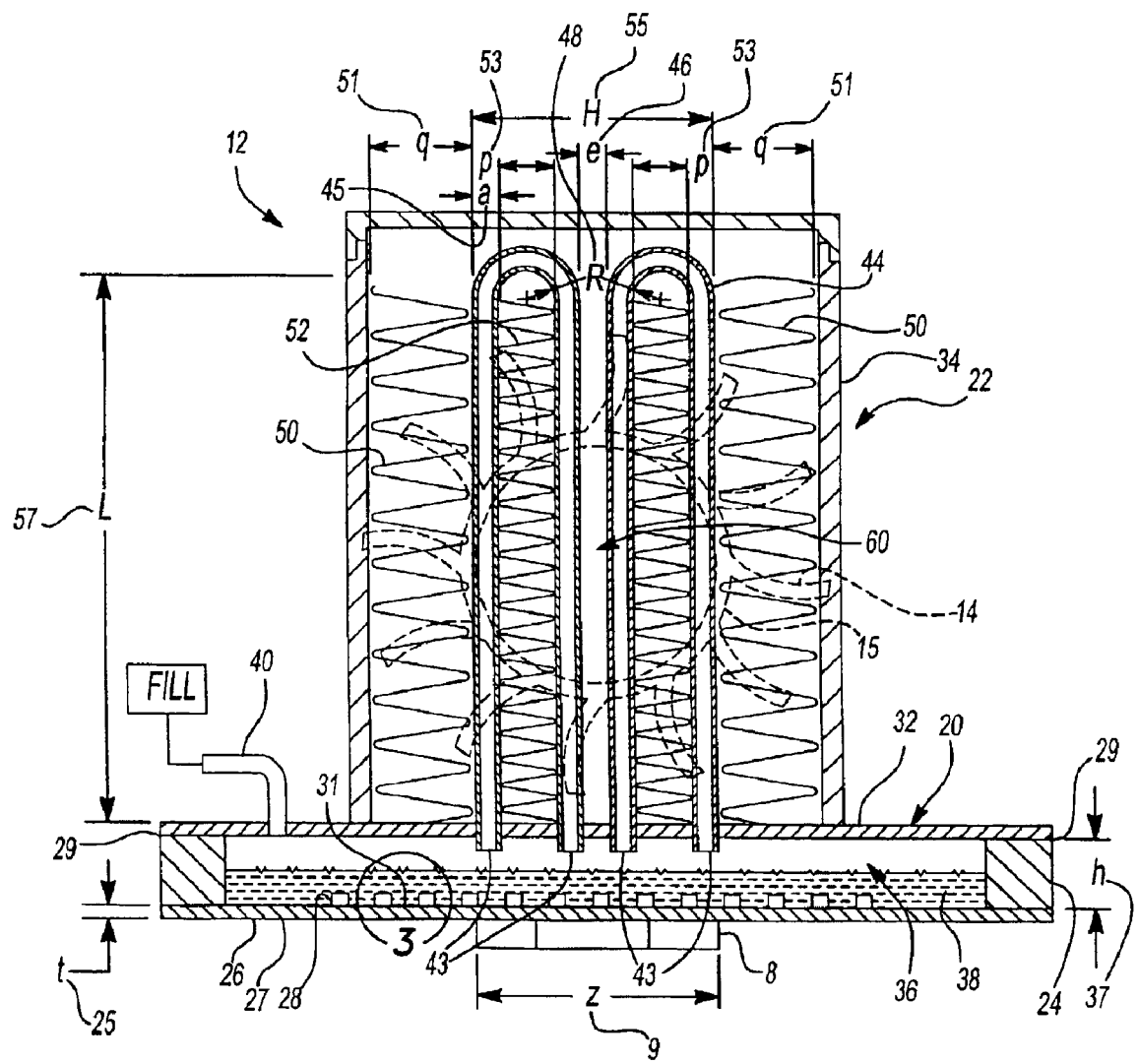
FIG. 2 is an elevational cross-section view of the thermosiphon shown in FIG. 1 and taken along the line 2—2.
Figure 3:
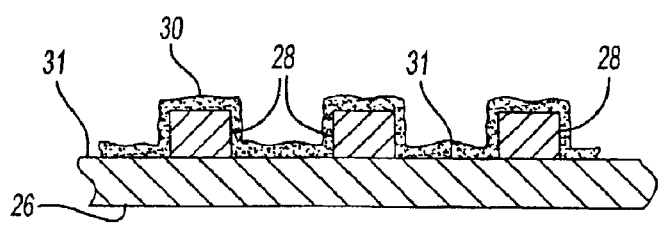
FIG. 3 is an enlarged segment of the cross-sectional view of the boilerplate shown in FIG. 2.

For purposes of description herein, the terms "upper", "lower", "left", "rear", "right", "front", "vertical", "horizontal", and derivatives thereof shall relate to the invention as oriented in FIG. 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Turning to the drawings, FIG. 1 shows an air-cooled thermosiphon heat sink 10, which is one of the preferred embodiments of the present invention and illustrates its various components.

As illustrated in FIG. 1 a single axial fan 14 is housed in shroud 16 and coupled to thermosiphon 12 through duct 18. The fan 14 could be a pull or push type fan, however, a pull type of fan is preferred to minimize shadowing of the thermosiphon 12 by the fan hub 15. The shadowing effect of hub 15 occurs over a lateral width 55 denoted by dimension "H" and substantially at a center of thermosiphon 12. The shadowing effect of hub 15 is greater with a push type fan than a pull type fan and reduces the airflow behind the hub and thereby interferes with the heat transfer from thermosiphon 12 to the cooling air stream.

Although axial fan 14 is configured as a pull type fan, and thereby minimizes the shadowing effect, FIGS. 4, 5A and 5B illustrate the differences between the heat distribution of the device 8 to be cooled and the areas of maximum airflow of fan 14. As shown in FIG. 4, the heat distribution of device 8 approximates a bell curve with the greatest heat at the area above the center of device 8. Conversely, the area of maximum airflow in push mode, as illustrated in FIG. 5A, appears as an inverse of the heat distribution, namely minimal airflow in the middle and maximum airflow at the outmost portion of the fan. In like manner, FIG. 5B illustrates the airflow in pull mode being similar to the push mode airflow illustrated in FIG. 5A. Therefore, without any enhancements, the fan generates maximum airflow over the minimum heat regions and low airflow over the regions of maximum heat.

FIG. 2 shows a sectional view of a preferred embodiment of the thermosiphon 12. Thermosiphon 12 comprises an evaporator 20 and a condenser 22 mounted thereabove.

The evaporator 20 comprises a baseplate 26 having a thickness 25 denoted by dimension "t" and sidewalls 24 about a periphery of baseplate 26. The thickness 25 "t" of the evaporator base plate 26 is suitably chosen based on an analysis of the particular boiling and heat transfer considerations for a desired application. Electronic device 8 having a mean width 9 denoted by dimension "z" is attached to a bottom surface 27 of baseplate 26 using a heat conductive adhesive, also known as "thermal grease". Bottom surface 27 is preferably polished for attachment of electronic device 8 to enhance the thermal contact from device 8 to baseplate 26.

An upper surface of baseplate 26 defines boiling surface 31 and can have a plurality of stud fins 28 formed thereon.

Stud fins 28 are preferably machined as an integral part of baseplate 26 for maximum heat transfer. The boiling surface 31 of baseplate 26 can also have a surface coating 30 deposited thereon to enhance the boiling properties of boiling surface 31. Surface coating 30 can comprise a sintered metal powder of aluminum or copper.

Sidewalls 24 have a height 37 denoted by dimension "h" and have a bottom affixed to baseplate 26. Sidewalls 24 can also be integrally formed with base 26 as a single structure. An upper surface of sidewalls 24 defines an upper horizontal flange 29 about the periphery of evaporator 20 to which the base 32 of condenser 22 is attached thereby defining evaporating chamber 36. The height of evaporating chamber 36 is also represented by dimension "h". Base 32 is preferably affixed to flange 29 by one of brazing, welding or diffusion bonding to form a leakproof chamber 36. The flange joint between the sidewalls 24 and base 32 can be enhanced by means of a trunion groove type mating of the protruding and recessed side of the flange prior to brazing or welding. A good joint can also be enhanced by means of peripheral screws (not shown) fastening base 32 to sidewalls 24. The screws provide additional reinforcement and prevent leakage at high pressure. Evaporation chamber 36 is charged with a working fluid 38 through charging port 40 in base 32. Chamber 36 also functions as a manifold to distribute saturated or super-heated vapor into the hairpin condenser tubes 44.

Condenser 22 comprises base 32 and two hairpin condenser tubes 44. Hairpin tubes 44 are formed in an inverted "U" shape wherein each leg thereof has a respective inlet end 43 extending through base 32 into evaporation chamber 36. Inlet ends 43 are open and place an interior of tubes 44 in fluid communication with evaporation chamber 36. In this manner, working fluid vapor formed as a result of boiling on the boiling surface 31 can enter either end of hairpin tubes 44 and rise therein for the ultimate dissipation of heat. Each of hairpin tubes 44 has a width 45 denoted by the dimension "a"; a bend radius 48 at an upper end thereof denoted by the dimension "R"; and is positioned above the area of high heat flux $\dot{q}"$ of device 8. Radius 48 (R) is selected such that tubes 44 and their respective legs form a tube grouping behind fan hub 15 within hub 15 diameter 55 as denoted by dimension "H". Thus, hairpin tubes 44 reside in the wake of hub 15 in the middle of the thermosiphon 12, and serve primarily as conduits for vapor flow between the evaporator 20 and the condenser 22.

Tubes 44 have a minimal lateral tube spacing 46 denoted by dimension "e". The properties of base 32, and the minimum distance permissible for forming slots to receive the tube ends therein govern tube spacing 46. The spacing 46 (e) between the tubes 44 serves as a high aspect ratio rectangular duct 60 of cross section e×D where D is the depth of tubes along the direction of the axial airflow through thermosiphon 12. Central duct 60 has a low airside pressure drop compared to fins and high heat transfer coefficient approaching that of two infinite parallel plates. The airflow through the central duct 60 serves to condense some of the vapor on the bare side of tubes 44 though most of the condensation is skewed on the finned side of tubes 44.

Two types of fins are used in condenser 22 of thermosiphon 12. First fins 50 having a height 51, denoted by dimension "q", are intentionally placed outside of tubes 44 and are substantially inline with the fan blades of axial fan 14 where the airflow is high. Second fins 52 having a height 53, denoted by dimension "p", are placed in the low flow region directly behind the hub 15 between the legs of each hairpin tube 44. Fins 50 and 52 are generally of a convoluted accordion configuration and have their apexes bonded to the surface of tubes 44 or housing 34 they contact. Housing 34 encases tubes 44, first fins 50 and second fins 52 to direct and maintain the airflow from fan 14 thereover.

The preferred working fluid of thermosiphon 12 is a fluid such as demineralized water, methanol or a halocarbon such as R134a ($C_2H_2F_4$). For a thermosiphon 12 utilizing R134a as working fluid 38, both the evaporator and condenser can be fabricated out of aluminum. However, an aluminum evaporator or condenser cannot be used when water is the working fluid in view of the corrosive effect of water on aluminum over time. An all-aluminum construction has the benefit of reduced manufacturing costs. Because of its low thermal conductivity, aluminum presents a higher thermal resistance in comparison to copper. Therefore, an evaporator 20 constructed from aluminum is not suitable when the heat flux generated by the electronics device 8 is very high. Copper is the preferred material of construction for evaporator 20 when the heat flux generated by the electronics device 8 is very high. Copper also has the benefit of usability for both R134a and water based working fluids 38, while aluminum is generally suitable only for an R-134a working fluid.

Based on theoretical and experimental study, the following dimensions of thermosiphon 12 found to be optimal: the ratio of the width 45 of tubes 44 to hub diameter 55 of fan 14 is expressed by the relationship $0.08 \leq a/H \leq 0.25$; the ratio of the height 53 of second fins 52 to hub diameter 15 of fan 14 is expressed by the relationship $0.125 \leq p/H \leq 0.5$; the ratio of the height 51 of first fins 50 to diameter 55 of hub 15 of fan 14 is expressed by the relationship $0.15 \leq q/H \leq 0.5$; and the ratio of the height 37 of evaporating chamber 36 to the height 57 of tubes 44 is expressed by the relationship $0.075 \leq h/L \leq 0.25$. The linear fin density of each fin strip ranges from 8 fins per inch to 20 fins per inch.

In use, as device 8 generates power and thus, heat, the heat so generated is transferred to baseplate 26. As baseplate and especially fins 28 increase in temperature, surface 30 becomes sufficiently hot to cause the working liquid covering the baseplate 26 to nucleate or boil. The working fluid vapor rises and enters hairpin condenser tubes 44. The heated vapor contacts the sidewalls of tubes 44 and transfers the thermal energy in the vapor to the walls of tubes 44 and thereafter by conduction to convoluted fins 50 and 52. Axial fan 14 causes cooling air to flow primarily through convoluted first fins 50 and secondarily through second fins 52 and duct 60, convectively drawing heat therefrom. By removing thermal energy from the vapor, the vapor is cooled below its condensation temperature and condenses on the interior walls of tubes 44. The condensed liquid congregates and falls back through tubes 44 to the pool of working fluid in vapor chamber 38 whereupon the process is repeated.

Figure 6:
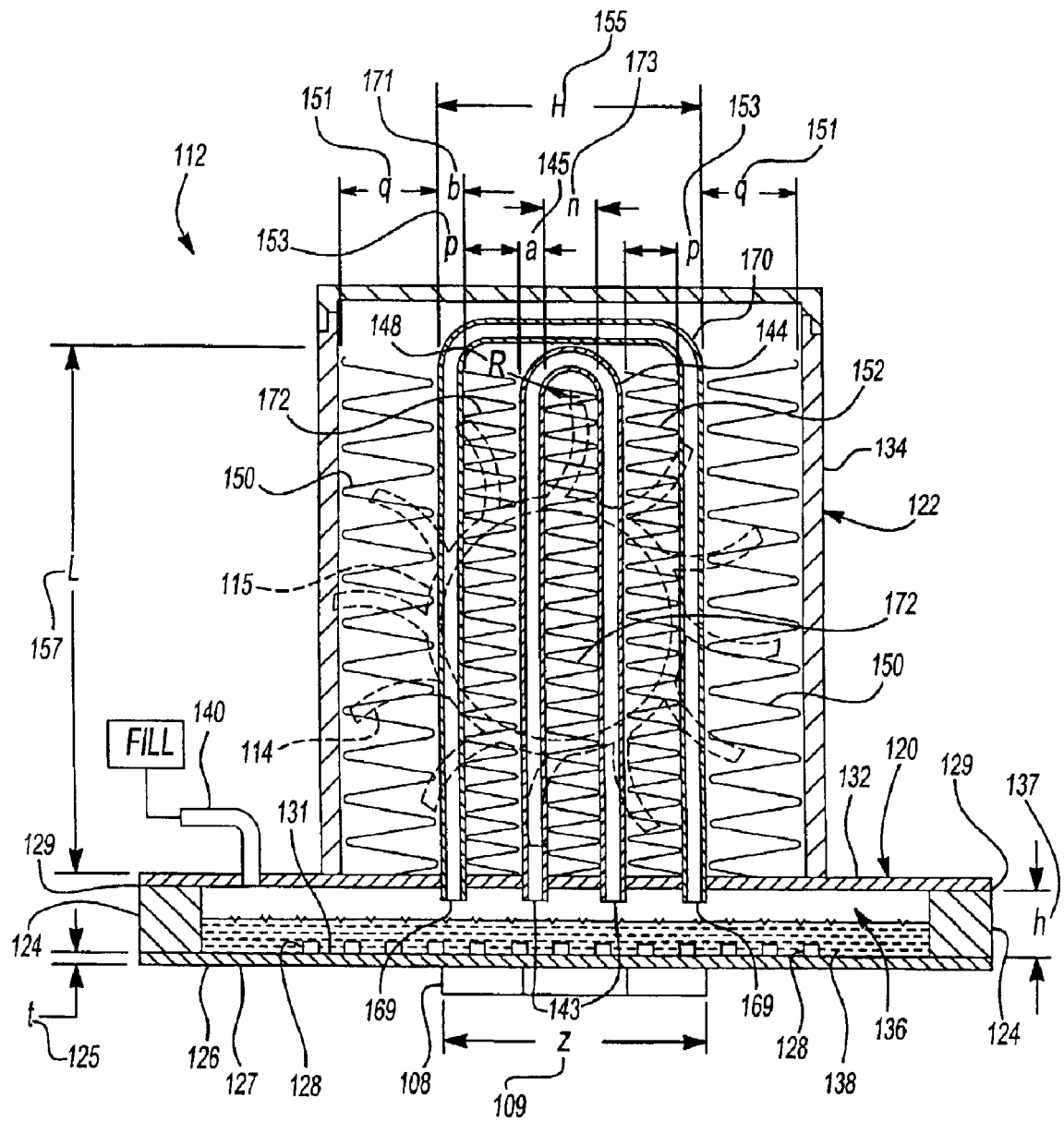
FIG. 6 is an elevational cross-section view of a second embodiment thermosiphon.

Turning now to FIG. 6 another embodiment 112 of a thermosiphon is illustrated wherein like features according to the previous embodiment are identified with like numbers preceded by the numeral "1". In describing thermosiphon 112 of FIG. 6, only the components that differ from the components of thermosiphon 12 of FIG. 2 will be described below since the common components are already described with reference to FIG. 2.

In the embodiment of FIG. 6, two different tube heights are used in order to utilize the region shadowed by fan hub 15 for vapor flow. A hairpin tube 144 has a width 145 denoted by dimension "a" and is bent to a small radius 148 denoted by dimension "R". Hairpin tube 144 is placed substantially above the highest heat flux $\dot{q}"$ region (the center) of device 108. The intervening space between the innermost tube segments of hairpin tube 144 is filled with third convoluted fins 172 having a height 173 denoted by dimension "n". Wide tube 170 has a height slightly greater than hairpin tube 144 and is formed to envelop the hairpin tube 144 within its inverted U-shape. Ends 169 of tube 170 extend through base 132 such that an interior of tube 170 is in fluid communication with vapor chamber 136 through either end 169. Wide tube 170 has a width 171 denoted by dimension "b" which is generally larger, and thus less restrictive, than width 145 of tube 144. Second fins 152 having a height 153 denoted by the dimension "p" extend between adjacent legs of tubes 144 and 170. Enveloping the tube 144 by tube 170 in this fashion helps to maintain structural integrity at high internal pressure and also facilitates manufacturing.

By selecting third convoluted fin 172 having a height 173 and tube 144 having a small bend radius 148, wide tube 170 can be kept relatively close to device 108. The top of wide tube 170 can also be angled from the horizontal to prevent condensate build up and thus, always ensure the condensate return from the top of tube 170 to the chamber 136. The size of the hairpin tube 144 having bend radius 145 and the short height 173 of fins 172 is selected specifically to utilize the low airflow in the region of hub 115. Strategic placement of wide tube 170 on the outside of tube 144, but within the width 155 of fan hub 115, enables heat dissipation through first fins 150. The majority of the vapor generated in vapor chamber 138 flows through the less restrictive wide tube 170 with larger cross-section and hence with lower flow resistance. First fins 150 are bonded to wide tube 170 and shroud 134 and are positioned in the wake of the fan blades of fan 114, therefore ensuring good airflow and lower overall airside pressure drop. In this fashion, fins 150 are placed in the periphery of thermosiphon 112 and are utilized to dissipate the majority of the latent heat from the vapor carried by tube 170.

For the embodiment illustrated in FIG. 6 as thermosiphon 112, and through careful design and test iterations, it was established that the benefits of the present embodiment are best realized within the following ranges of the key dimensions: The ratio of the width 145 of tube 144 to hub diameter 155 of fan 114 is expressed by the relationship $0.08 \leq a/H \leq 0.2$. The width of wide tube 170 to hub diameter 155 is expressed by the relationship $0.125 \leq b/H \leq 0.5$. The ratio of the height 153 of third fins 152 to hub diameter 155 of fan 114 is expressed by the relationship $0.08 \leq n/H \leq 0.4$. The ratio of the height 151 of first fins 150 to diameter 155 of hub 115 is expressed by the relationship $0.2 \leq q/H \leq 0.5$. The ratio of the height 153 of second fins 152 to diameter 155 of hub 115 is expressed by the relationship $0.08 \leq p/H \leq 0.375$. The ratio of the height 137 of evaporating chamber 136 to the height 157 of tubes 144 is expressed by the relationship $0.075 \leq h/L \leq 0.25$. The linear fin density of each fin strip ranges from 8 fins per inch to 20 fins per inch.

Figure 7:
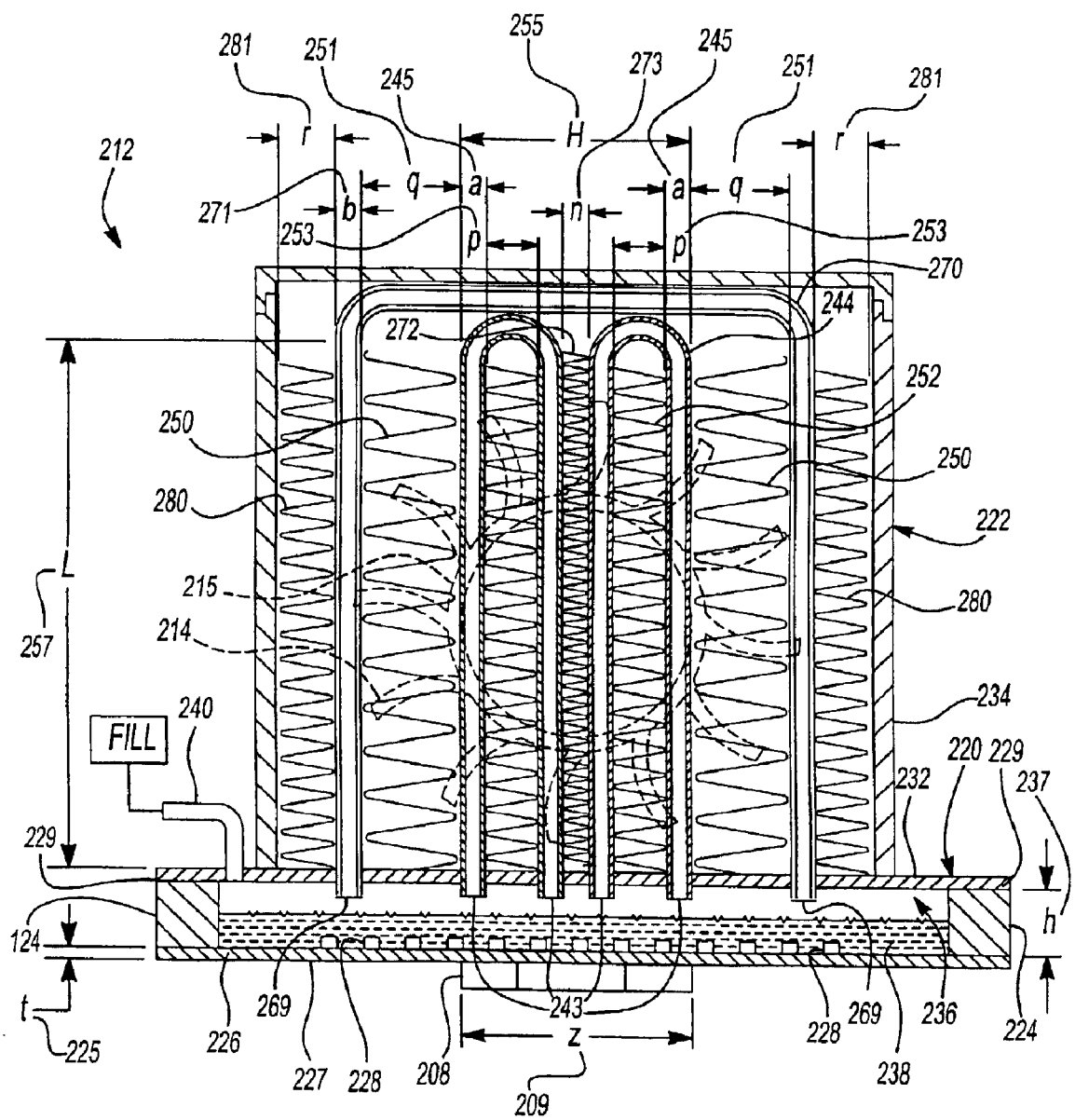
FIG. 7 is an elevational cross-section view of a third embodiment thermosiphon.

Turning now to FIG. 7 another embodiment 212 of a thermosiphon is illustrated wherein like features according to the previous embodiment are identified with like numbers preceded by the numeral "2". In describing thermosiphon 212 of FIG. 7, only the components that differ from the components of previous embodiments of FIGS. 2 and 6 will be described below since the common components are already described with reference to previous embodiments.

The embodiment illustrated in FIG. 7 employs two hairpin tubes 244 within a wide tube 270. Hairpin tubes 244 are positioned directly over device 208 where the maximum heat flux q" region is realized. Wide tube 270 encompasses both hairpin tubes 244 and generally extends the width of fan 214. Thermosiphon 212 fully addresses the non-uniformity of the airflow.

Fin sizes as well as the linear fin densities are varied to conform to the airflow induced by the fan. Third fins 272 having a height 273 denoted by dimension "n" are placed between two closely spaced hairpin tubes 244. Second fins 252 are medium sized having a height 253 denoted by dimension "p" and are positioned interiorly of the legs of each hairpin tube 244. First fins 250 having a height 251 denoted by dimension "q" are positioned between hairpin tubes 244 and wide tube 270 in the region corresponding to the maximum airflow from fan 214. Outer fins 280 extend between tube 270 and shroud 234 outside of the primary airflow stream of fan 214. Fins 280 are of medium size and have a height 281 denoted by dimension "r".

This design is suitable for high heat load as well as for high heat flux. By employing non-uniform fins sizes, the pressure drop registered by the flowing air from fan 214 is utilized profitably for carrying waste heat. If the fins were of uniform size and density, the pressure drop would have still occurred, however, the heat pick up would have been less due to a reduced availability of vapor flow rate at the periphery. Selecting small bend radii and fins having a correspondingly relatively small height permits concentrating a maximum of tube space directly above the core of the heat-generating device 208. In this way, the tube entrance losses are minimized for vapor flow and thereby maintaining an overall low vapor side pressure drop. As evident from FIG. 7, tubes 244 are bundled behind the fan hub 215 and significant portion of the finned area is placed behind the blades of fan 214. Additional modulation of the airflow to qualitatively mimic the heat flux profile can be achieved by lowering the fin density in the middle and increasing the fin density at the periphery.

For the embodiment illustrated in FIG. 7 as thermosiphon 212, and through careful design and test iterations, it was established that the benefits of the present embodiment are best realized within the following ranges of the key dimensions. The ratio of the width 245 of tube 244 to hub diameter 255 of fan 214 is expressed by the relationship $0.08 \leq a/H \leq 0.25$. The width 271 of wide tube 270 to hub diameter 255 is expressed by the relationship $0.08 \leq b/H \leq 0.2$. The ratio of the height 253 of second fins 252 to hub diameter 255 of fan 214 is expressed by the relationship $0.1 \leq p/H \leq 0.3$. The ratio of the height 281 of outer fins 280 to diameter 255 of hub 215 is expressed by the relationship $0.1 \leq r/H \leq 0.2$. The ratio of the height 251 of first fins 250 to diameter 255 of hub 215 is expressed by the relationship $0.2 \leq q/H \leq 0.4$. The ratio of the height 237 of evaporating chamber 236 to the height 257 of tubes 244 is expressed by the relationship $0.075 \leq h/L \leq 0.25$. The linear fin density of each fin strip ranges from 8 fins per inch to 20 fins per inch.

Figure 8:
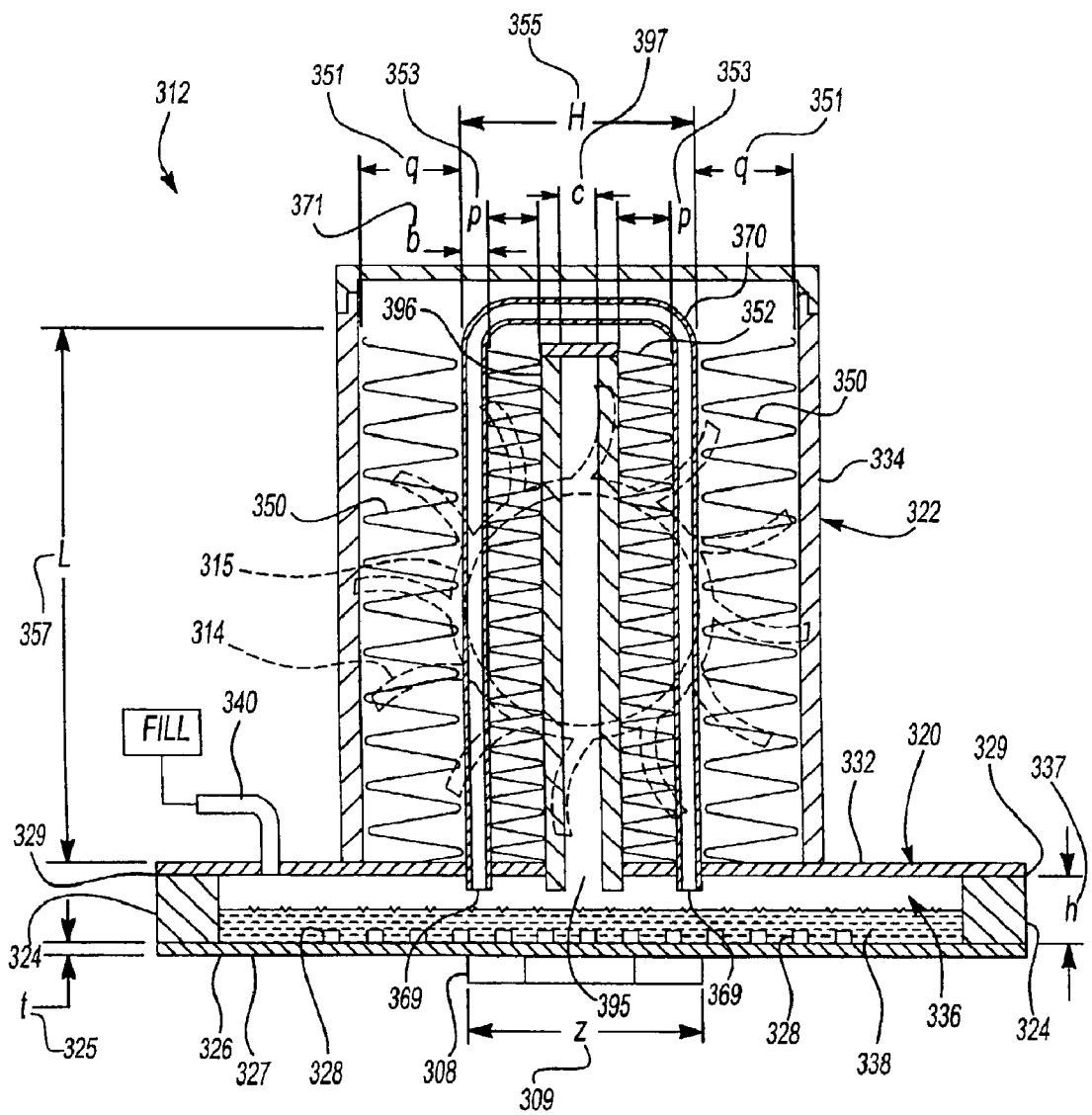
FIG. 8 is an elevational cross-section view of a fourth embodiment thermosiphon.

Turning now to FIG. 8 another embodiment 312 of a thermosiphon is illustrated wherein like features according to the previous embodiment are identified with like numbers preceded by the numeral "3". In describing thermosiphon 312 of FIG. 8, only the components that differ from the components of previous embodiments of FIGS. 2 and 6–7 will be described below since the common components are already described with reference to previous embodiments.

As illustrated in FIG. 8, the hairpin tube 144 of thermosiphon 112 as illustrated in FIG. 6 has been combined into a single central stem tube 396 in thermosiphon 312. The single tube 396 reduces the number of brazing joints and thereby further reduces the potential for leakage of the working fluid from the thermosiphon 312 since tube 396 has only one inlet 395 extending through base 332 into evaporating chamber 336. Thermosiphon 312 utilizes different tube and different fin sizes. The central stem tube 396 has a width 397 denoted by dimension "c" of wider cross-section than previous tube 44. Central stem tube 396 is placed centrally behind fan hub 315 and directly above the high heat flux region of device 308. Tube 396 is sealed at its top. Wide tube 370 has a width 371 denoted by dimension "b" and is formed to have a substantially flat top over the top of central stem tube 396. First fins 350 at the periphery have a height 351, denoted by dimension "q", and are substantially in line with the airflow from fan 314. First fins 350 are generally of the same height or taller than second fins 352 having a height 353 denoted by dimension "p".

Thermosiphon 312 is particularly suited for high heat flux and very concentrated heat loads, and where spreading of heat is difficult and the vapor side pressure drop requirement is low. Additionally, central stem tube 396 significantly enhances heat transfer performance of the evaporator as a result of condensate dripping into the liquid pool 338 directly over the center of device 308. This improves the performance of the boiling surface at very high heat flux.

For the embodiment illustrated in FIG. 8 as thermosiphon 312, and through careful design and test iterations, it was established that the benefits of the present embodiment are best realized within the following ranges of the key dimensions. The ratio of the width 397 of tube 396 to hub diameter 355 of fan 314 is expressed by the relationship $0.125 \leq c/H \leq 0.3$. The width 371 of wide tube 370 to hub diameter 355 is expressed by the relationship $0.08 \leq b/H \leq 0.2$. The ratio of the height 353 of second fins 352 to hub diameter 355 is expressed by the relationship $0.1 \leq p/H \leq 0.325$. The ratio of the height 351 of first fins 350 to diameter 355 of hub 315 is expressed by the relationship $0.2 \leq q/H \leq 0.5$. The ratio of the height 337 of evaporating chamber 336 to the height 357 of wide tube 370 is expressed by the relationship $0.1 \leq h/L \leq 0.375$. The linear fin density of each fin strip ranges from 8 fins per inch to 20 fins per inch.

In the foregoing description those skilled in the art will readily appreciate that modifications may be made to the invention without departing from the concepts disclosed herein. Such modifications are to be considered as included in the following claims, unless these claims expressly state otherwise.

We claim:

1. A heat sink assembly for cooling an electronic device, said heat sink assembly comprising:
    a fan housed in a shroud, said fan including a hub having a diameter "H" and fan blades extending therefrom for causing an axially directed airflow through said shroud upon rotation of said fan blades; and
    a thermosiphon comprising an evaporator defining an evaporating chamber containing a working fluid therein and a condenser mounted thereabove, said thermosiphon positioned at one end of said shroud such that said fan is aligned with said condenser for directing said axial airflow therethrough; wherein:
    said condenser includes a plurality of tubes forming a tube grouping, each said tube having an opening in fluid communication with said evaporator and for receiving and condensing vapor of said working fluid from said evaporator, said tubes being axially aligned with said airflow and laterally positioned such that a lateral width of said tube grouping is approximately equal to a width of said fan hub and substantially in lateral alignment therewith.

2. The heat sink assembly according to claim 1 wherein said evaporator includes a baseplate and has an electronic device to be cooled mounted on a bottom surface thereof.

3. The heat sink assembly according to claim 2 wherein said baseplate has an upper surface defining at least a portion of said evaporation chamber and includes a plurality of fins on said upper surface, said fins extending into said evaporating chamber.

4. The heat sink assembly according to claim 3 wherein said upper surface and said fins have a rough surface coating thereon.

5. The heat sink assembly according to claim 4 wherein said rough surface coating comprises a sintered metal layer.

6. The heat sink assembly according to claim 2 wherein said baseplate has an upper surface defining at least a portion of said evaporation chamber and has a rough surface coating thereon.

7. The heat sink assembly according to claim 6 wherein said rough surface coating comprises a sintered metal layer.

8. The heat sink assembly according to claim 2 wherein said tubes have a height dimension "L", and said evaporator has a height dimension "h" such that the ratio h/L falls within the expression $0.075 \leq h/L \leq 0.375$.

9. The heat sink assembly according to claim 2 wherein said tube openings are substantially vertically aligned over said electronic device.

10. The heat sink assembly according to claim 1 further including a primary convoluted fin affixed to each of outermost tubes of said tube grouping and laterally extending substantially to a tip diameter of said fan blades.

11. The heat sink assembly according to claim 1 wherein said tubes have a width dimension "a", such that the ratio a/H falls within the expression $0.08 \leq a/H \leq 0.25$.

12. The heat sink assembly according to claim 1 further including a primary convoluted fin affixed to each of outermost tubes of said tube grouping and laterally extending outwardly therefrom wherein said primary convoluted fin has a height dimension of "q" such that the ratio q/H falls within the expression $0.15 \leq q/H \leq 0.5$.

13. The heat sink assembly according to claim 12 wherein said primary convoluted fin has a fin density falling within the range of 8–20 fins per inch.

14. The heat sink assembly according to claim 12 wherein at least a first of said tubes has an inverted U-shape having two downwardly extending legs and further wherein each leg has an opening in fluid communication with said evaporating chamber.

15. The heat sink assembly according to claim 14 wherein said first of said tubes has said diameter dimension "b", such that the ratio b/H falls within the expression $0.08 \leq b/H \leq 0.5$.

16. The heat sink assembly according to claim 14 wherein at least a second of said tubes is positioned within said U-shape of said first tube.

17. The heat sink assembly according to claim 16 wherein said at least second tube has an inverted U-shape having two downwardly extending legs and further wherein each leg has an opening in fluid communication with said evaporating chamber.

18. The heat sink assembly according to claim 17 wherein adjacent ones of said legs of said first and second tubes have a secondary convoluted fin extending therebetween.

19. The heat sink assembly according to claim 18 wherein said secondary convoluted fin has a height dimension of "p" such that the ratio p/H falls within the expression $0.08 \leq p/H \leq 0.5$.

20. The heat sink assembly according to claim 19 wherein said primary convoluted fin and said secondary convoluted fin have a fin density falling within the range of 8–20 fins per inch.

21. The heat sink assembly according to claim 19 wherein said primary convoluted fin has a fin density different than said secondary convoluted fin.

22. The heat sink assembly according to claim 17 wherein two innermost ones of said legs of said first and second tubes define an unobstructed duct therebetween.

23. The heat sink assembly according to claim 17 further including a third convoluted fin extending between two innermost ones of said legs of said first and second tubes.

24. The heat sink assembly according to claim 16 wherein said second tube comprises a central stem tube having a single inlet in fluid communication with said evaporator.

25. The heat sink assembly according to claim 24 wherein said central stem tube has a width dimension "c", such that the ratio c/H falls within the expression $0.125 \leq c/H \leq 0.3$.

26. The heat sink assembly according to claim 11 further including an outer tube surrounding said tube grouping and having an inverted U-shape with two downwardly extending outer legs, an end of each leg having an opening in fluid communication with said evaporating chamber, each said outer leg affixed to an outer end of an adjacent one of said primary convoluted fins.

27. The heat sink assembly according to claim 26 further including an outer convoluted fin extending outwardly from each of said legs of said outer tube.

28. The heat sink assembly according to claim 27 wherein said outer convoluted fin has a height dimension of "r" such that the ratio r/H falls within the expression $0.1 \leq r/H \leq 0.2$.

29. A condenser for a heat sink assembly for cooling an electronic device, said condenser comprising:
   a base having an upper housing affixed thereto, said upper housing having open ends;
   a fan mounted at one of said open ends, said fan including a hub having a diameter "H" and fan blades extending therefrom for causing an axially directed airflow through said housing upon rotation of said fan blades;
   a plurality of tubes within said housing for transmitting therethrough a vapor of a working fluid, said tubes defining a tube grouping, said tubes being arranged in axial alignment with said fan hub and laterally positioned such that a lateral width of said tube grouping is approximately equal to said diameter of said hub and substantially in lateral alignment therewith.

30. A condenser according to claim 29 wherein each said tube defines at least one opening for receiving into said tube a vapor of a working fluid and for discharge of condensed working fluid.

31. A condenser according to claim 30 further including a primary convoluted fin affixed to each of outermost tubes of said tube grouping and laterally extending substantially to a tip diameter of said fan blades.

32. A condenser according to claim 29 wherein said tubes have a width dimension "a", such that the ratio a/H falls within the expression $0.08 \leq a/H \leq 0.25$.

33. A condenser according to claim 29 further including a primary convoluted fin affixed to each of outermost tubes of said tube grouping and laterally extending outwardly therefrom wherein said primary convoluted fin has a height dimension of "q" such that the ratio q/H falls within the expression $0.15 \leq q/H \leq 0.5$.

34. A condenser according to claim 33 wherein said primary convoluted fin has a fin density falling within the range of 8–20 fins per inch.

35. A condenser according to claim 33 wherein at least a first of said tubes has an inverted U-shape having two downwardly extending legs and further wherein each leg has an opening for receiving into said tube a vapor of a working fluid and for discharge of condensed working fluid.

36. A condenser according to claim 35 wherein said first of said tubes has a width dimension "b", such that the ratio b/H falls within the expression $0.08 \leq b/H \leq 0.5$.

37. A condenser according to claim 35 wherein at least a second of said tubes is positioned within said U-shape of said first tube.

38. A condenser according to claim 37 wherein said second tube has an inverted U-shape having two downwardly extending legs and further wherein each leg has one of said openings.

39. A condenser according to claim 38 wherein adjacent ones of said legs of said first and second tubes have a secondary convoluted fin extending therebetween.

40. A condenser according to claim 39 wherein said secondary convoluted fin has a height dimension of "p" such that the ratio p/H falls within the expression $0.08 \leq p/H \leq 0.5$.

41. A condenser according to claim 40 wherein said primary convoluted fin and said secondary convoluted fin have a fin density falling within the range of 8–20 fins per inch.

42. A condenser according to claim 40 wherein said primary convoluted fin has a fin density different than said secondary convoluted fin.

43. A condenser according to claim 38 wherein two innermost ones of said legs of said first and second tubes define an unobstructed duct therebetween.

44. A condenser according to claim 38 further including a third convoluted fin extending between two innermost ones of said legs of said first and second tubes.

45. A condenser according to claim 37 wherein said second tube comprises a central stem tube having a single inlet opening for receiving into said tube a vapor of a working fluid and for discharge of condensed working fluid.

46. A condenser according to claim 45 wherein said central stem tube has a width dimension "c", such that the ratio c/H falls within the expression $0.125 \leq c/H \leq 0.3$.

47. A condenser according to claim 32 further including an outer tube surrounding said tube grouping and having an inverted U-shape with two downwardly extending outer legs, an end of each leg having an opening for receiving into said tube a vapor of a working fluid and for discharge of condensed working fluid, each said outer leg affixed to an outer end of an adjacent one of said primary convoluted fins.

48. A condenser according to claim 47 further including an outer convoluted fin extending outwardly from each of said legs of said outer tube.

49. A condenser according to claim 48 wherein said outer convoluted fin has a height dimension of "r" such that the ratio r/H falls within the expression $0.1 \leq r/H \leq 0.2$.

* * * * *